United States Patent

Masuda et al.

[11] Patent Number: 5,683,001
[45] Date of Patent: Nov. 4, 1997

[54] RACK FOR MOUNTING ELECTRONIC APPARATUSES

[75] Inventors: Norio Masuda; Toshiki Shimasaki; Makoto Moribe; Toru Aoyagi, all of Tokyo, Japan

[73] Assignee: NEC Corporation, Toyko, Japan

[21] Appl. No.: 341,357

[22] Filed: Nov. 17, 1994

[30] Foreign Application Priority Data

Dec. 3, 1993 [JP] Japan ................... 5-304197

[51] Int. Cl.[6] .................................. A47F 5/00
[52] U.S. Cl. ................... 211/26; 211/189; 361/829
[58] Field of Search .................... 211/26, 182, 189; 248/903; 52/167.3; 361/752, 759, 754, 796, 801, 829

[56] References Cited

U.S. PATENT DOCUMENTS

| | | | |
|---|---|---|---|
| 3,865,250 | 2/1975 | Jay | 211/182 X |
| 4,553,674 | 11/1985 | YoshikAwa et al. | 211/26 |
| 4,641,754 | 2/1987 | Hebel et al. | 211/26 |
| 4,896,992 | 1/1990 | Muhlethaler | 211/182 X |
| 5,004,107 | 4/1991 | Sevier et al. | 211/26 |
| 5,275,296 | 1/1994 | Zachrai | 211/26 |
| 5,298,681 | 3/1994 | Swift et al. | 361/829 X |
| 5,323,916 | 6/1994 | Salmon | 211/26 |
| 5,372,262 | 12/1994 | Benson et al. | 211/26 |

FOREIGN PATENT DOCUMENTS

| | | | |
|---|---|---|---|
| 60-141192 | 9/1985 | Japan . | |
| 61-81195 | 5/1986 | Japan . | |
| 61-156280 | 7/1986 | Japan . | |
| 62-262500 | 11/1987 | Japan . | |
| 4-189949 | 7/1992 | Japan | 52/167.3 |

Primary Examiner—Robert W. Gibson, Jr.

[57] ABSTRACT

A rack for mounting communication apparatuses or similar electronic apparatuses. The rack has a pair of posts symmetrical to each other in the right-and-left direction and each having a section in the form of a letter C. The posts are positioned such that the open side of "C" faces outward. A shelf included in an electronic apparatus is mounted to the posts. The posts are tied to each other by a top frame at upper ends and affixed to a base at lower ends. A generally L-shaped reinforcing member is connected to the lower portion of each post such that the longer side of "L" is parallel to the closed side of "C" representing the post, thereby providing the lower portion of the post with a hollow rectangular section. The reinforcing member is not connected to the base.

2 Claims, 5 Drawing Sheets

RACK FOR MOUNTING ELECTRONIC APPARATUSES

BACKGROUND OF THE INVENTION

The present invention relates to a rack for mounting electronic apparatuses and, more particularly, to a rack for mounting communication apparatuses and partly reinforced by reinforcing members.

A rack for the above application usually has a pair of posts symmetrical in the right-and-left direction, a top frame tying the upper ends of the posts, and a base to which the lower ends of the posts are affixed. The posts each has a section in the form of a letter C and is positioned such that the open side of "C" faces outward. The recesses, or channels, of the C-shaped posts are used as cable ducts. With the C-shaped section, the posts achieve great mechanical strength for their cost and weight. Flanges extending sideways from the front ends of the posts are used as surfaces for mounting a shelf included in an electronic apparatus. Specifically, flanges are provided on the shelf and fastened to the mounting surfaces of the posts by screws.

In the conventional rack described above, the posts are simple in configuration and low cost. However, the posts are not capable of achieving the maximum strength, or rigidity, within the limited space.

Racks for mounting electronic apparatuses are taught in, for example, Japanese Patent Laid-Open Publication Nos. 61-156280 and 62-262500 and Japanese Utility Model Laid-Open Publication Nos. 60-141192 and 61-81195. However, none of them is satisfactory in respect of strength.

SUMMARY OF THE INVENTION

It is, therefore, an object of the present invention to provide a rack for electronic apparatuses which achieves sufficient strength, or rigidity, by avoiding the contradictory relation between weight and secondary moment of section An independent rack for mounting electronic apparatuses of the present invention has a pair of posts symmetrical in a right-and-left direction as seen from the front and each having a section in the form of a letter C and being arranged such that the open side of "C" faces outward. A top frame ties the upper ends of the posts. The lower ends of the posts are affixed to a base. Members are provided for providing the lower portions of the posts adjoining the base with a hollow rectangular section.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
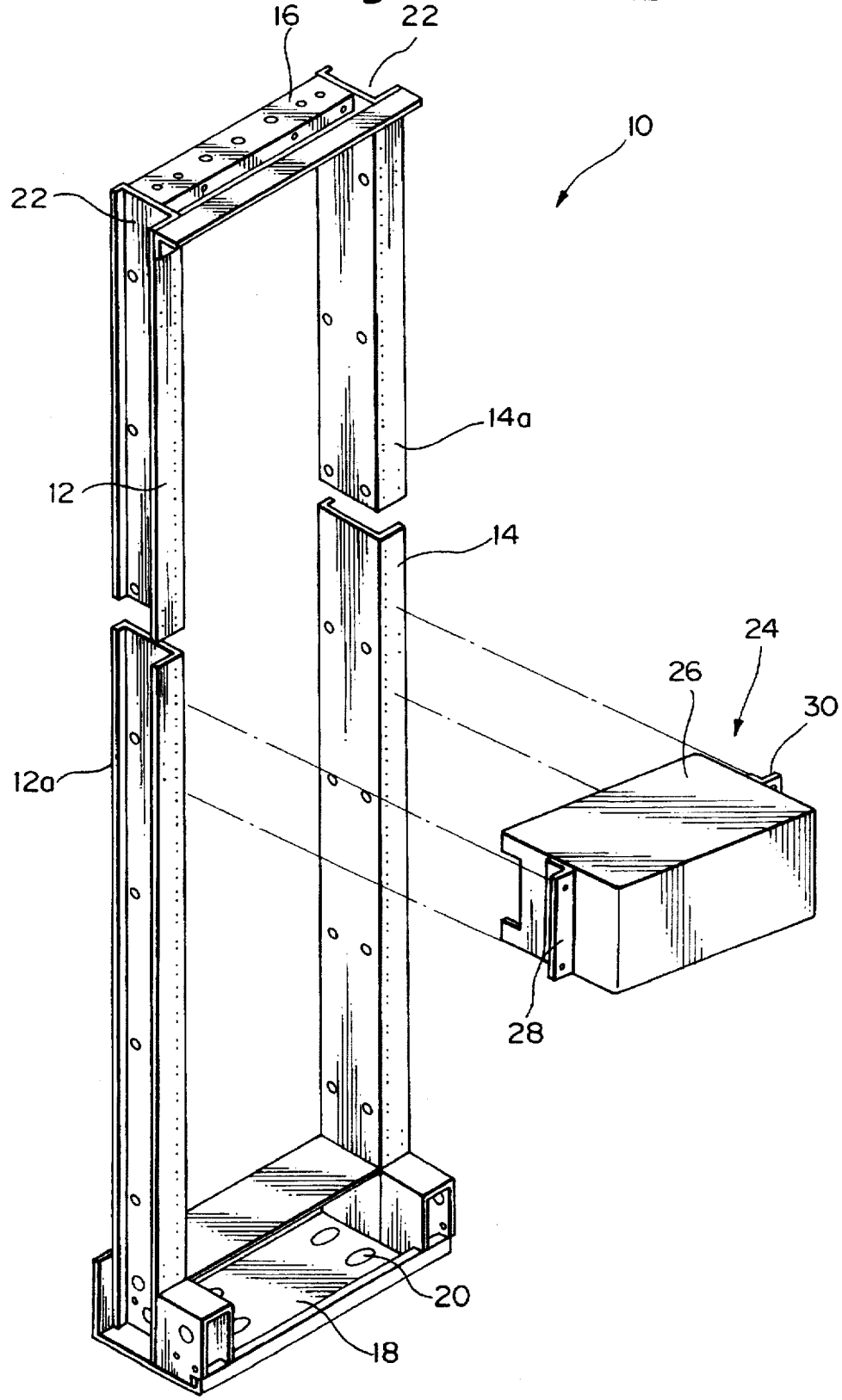
FIG. 1 is a perspective view of a conventional rack for electronic apparatuses.
Figure 2:
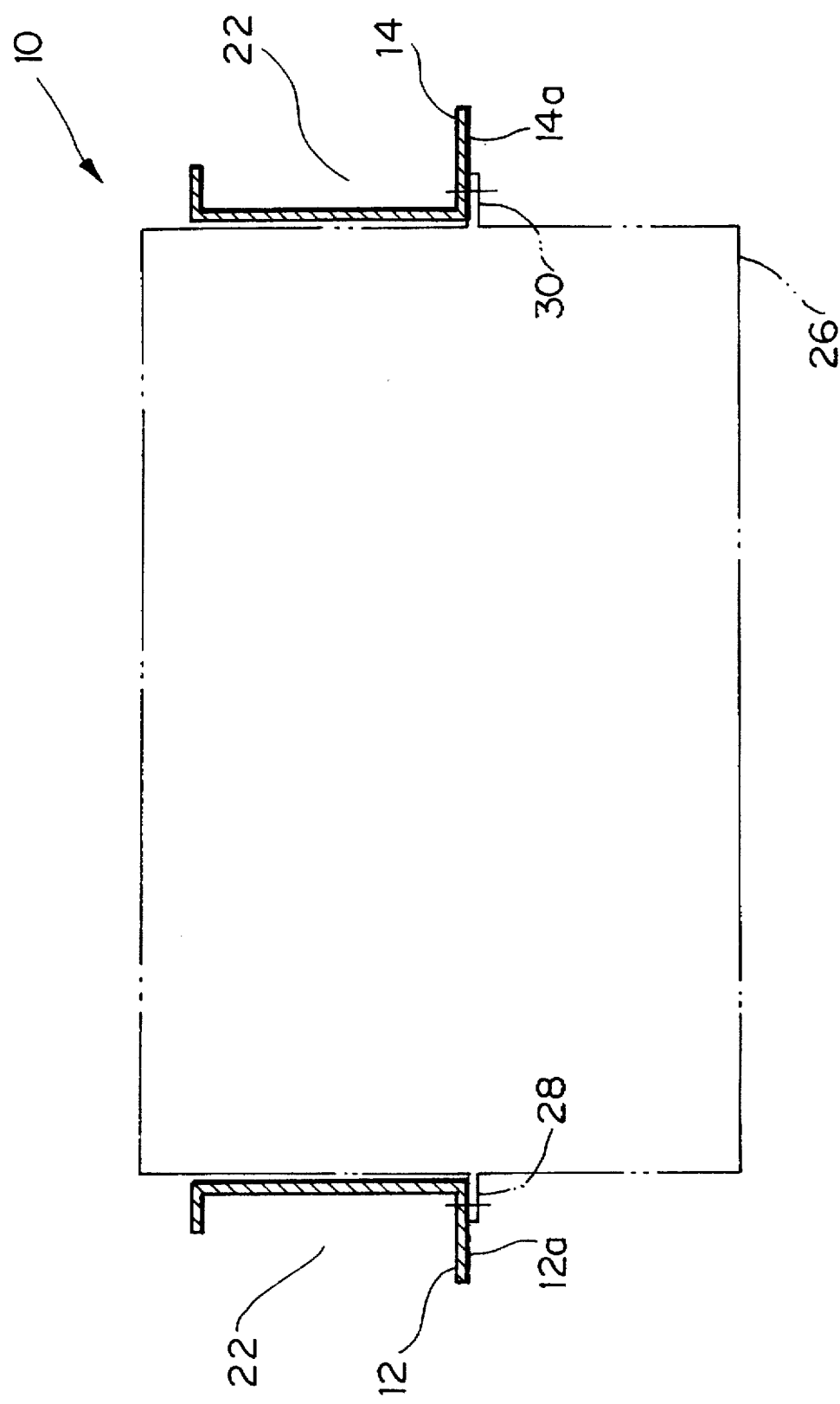
FIG. 2 is a horizontal section of the rack shown in FIG. 1.

To better understand the present invention, a brief reference will be made to a conventional rack for mounting communication apparatuses or similar electronic apparatuses, shown in FIG. 1. As shown, the rack, generally 10, has a pair of posts 12 and 14 symmetrical to each other in the right-and-left direction, as viewed in the figure. The posts 12 and 14 are tied together by a top frame 16 at the upper ends thereof. The lower ends of the posts 12 and 14 are affixed to a bottom frame or base 18. The base 18 is formed with holes 20 for mounting a communication apparatus 24. The posts 12 and 14 each has a section in the form of a letter C and is positioned such that the open side of "C" faces outward. The recesses, or channels, of the C-shaped posts 12 and 14 are used as cable ducts 22. With the C-shaped section, the posts 12 and 14 achieve great mechanical strength for their cost and weight. The front surfaces of flanges 12a and 14a extending sideways from the front ends of the posts 12 and 14, respectively, are used as surfaces for mounting a shelf 26 included in the apparatus 24. Specifically, flanges 28 and 30 are provided on the shelf 26 and respectively fastened to the surfaces 12a and 14a of the posts 12 and 14 by screws. FIG. 2 shows the shelf 26 mounted on the rack 10.

In the rack 10 described above, the posts 12 and 14 are simple in configuration and low cost. However, the posts 12 and 14 are not capable of achieving the maximum strength, or rigidity, within the limited space, as discussed earlier.

The strength noticeably differs from the front-and-rear direction to the right-and-left direction of the rack. Specifically, the strength in the right-and-left direction is only one-fifth to one-tenth of the strength in the front-and-rear direction in terms of sectional modulus. This, of course, applies to communication apparatuses of ordinary size. While the posts usually need only a degree of rigidity withstanding the ordinary manipulations of communication apparatuses, heavy horizontal loads are apt to act on the rack in the event of earthquakes. Moreover, it is likely that the resonance frequency of the rack loaded with communication apparatuses coincides with the frequency of seismic waves. Assuming that the rack has a resonance frequency Fr, the frequency Fr may be produced by the following equation by way of example:

$$Fr = \frac{1}{2\pi} (C_1/L)^2 C_2 \; EI/W$$

where W is the total weight of the rack and apparatuses mounted thereon, L is the height of the rack, E is the Young's modulus, I is the secondary moment of section, and $C_1$ and $C_2$ are coefficients.

To increase the resonance frequency Fr of the rack and, therefore, the strength against earthquakes, the secondary moment of section I of the posts may be increased. This, however, fails to increase the resonance frequency Fr since the weight W increases with the increase in moment I. For example, when each post is entirely reinforced by a reinforcing member from the top to the bottom to have a hollow rectangular section, the weight W is about 1.5 times as great as the weight W before reinforcement. Hence, the secondary moment of section may increase by about 1.2 times in the design aspect, preventing the resonance frequency Fr from increasing. Although additional reinforcement and modification of the shape may increase the secondary moment of section, this kind of approach not only increases the weight but also makes it difficult to, for example, accommodate cables in the rack and apparatuses mounted thereon.

Figure 3:
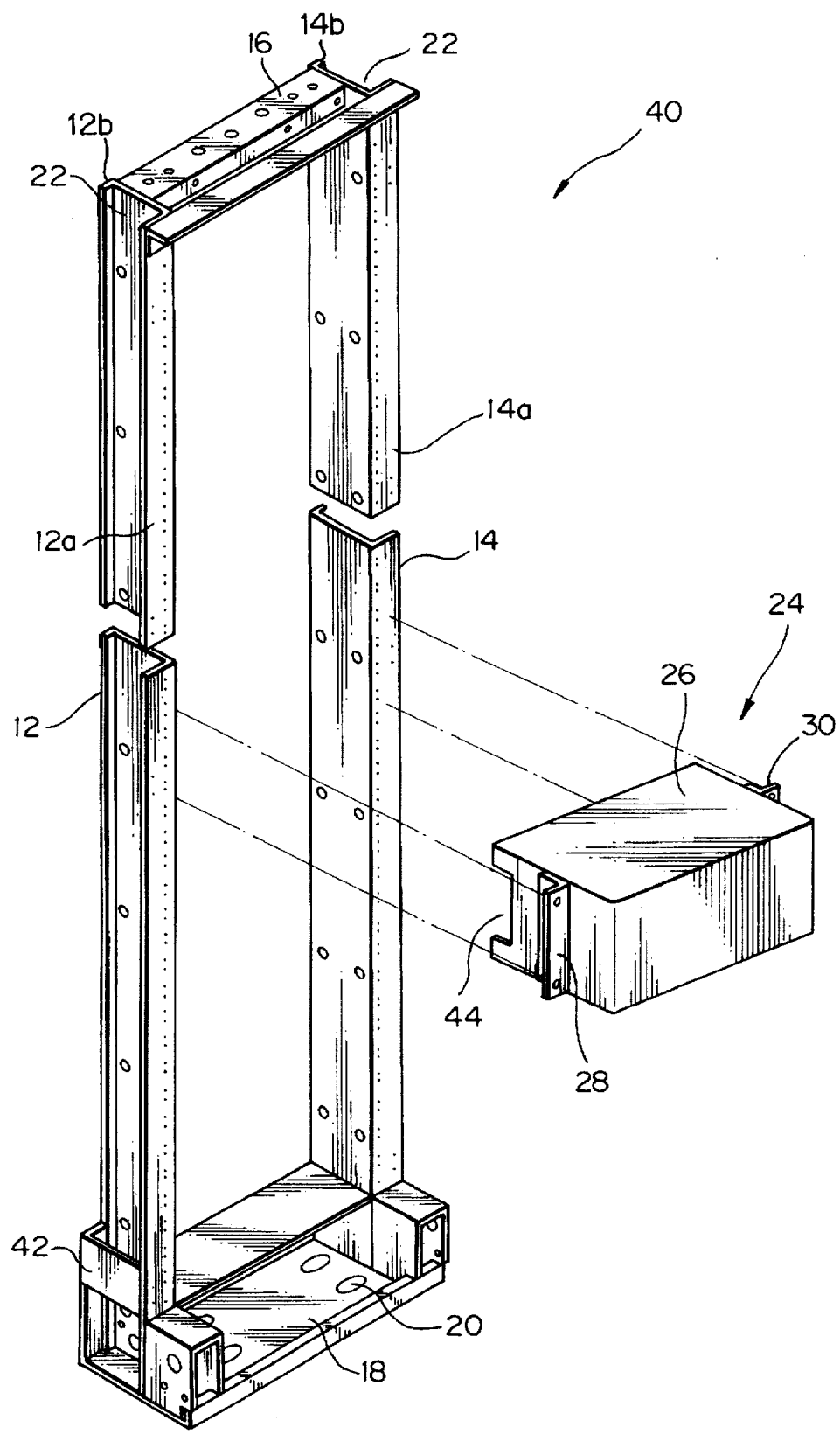
FIG. 3 is a perspective view of a rack embodying the present invention.

Referring to FIG. 3, a rack embodying the present invention is shown and generally designated by the reference numeral 40. In FIG. 3, the same or similar constituent parts as or to the parts shown in FIGS. 1 and 2 are designated by the same reference numerals. As shown, the rack 40 has a pair of posts 12 and 14 symmetrical to each other in the right-and-left direction. The posts 12 and 14 have their upper ends tied to each other by a top frame 16. The lower ends of the posts 12 and 14 are affixed to a base 18. The posts 12 and 14 each has a section in the form of a letter C (defined by plates 12, 14 and their flanges 12a, 12b and 14a, 14b) and is positioned such that the open side of "C" faces outward. The recesses, or channels, of the C-shaped posts 12 and 14 are used as cable ducts 22. The lower portions of the posts 12 and 14 each has a hollow rectangular section.

To provide the lower portion of each post 12 or 14 with a hollow rectangular section as mentioned above, use is made of a reinforcing member 42 having a section in the form of a letter L. The L-shaped reinforcing members 42 are respectively affixed to the lower portions of the posts 12 and 14 adjoining the base 18 such that the longer arm of "L" is parallel to the closed side of "C" representing the posts 12 and 14. The reinforcing members 42 are not connected to the base 18. A communication apparatus 24 has a shelf 26 thereof mounted to the front surfaces 12a and 14a of the posts 12 and 14. Cables, not shown, are received in cable ducts 22 implemented by the posts 12 and 14, as in the conventional rack. The cables are led into the shelf 26 via a cable inlet portion 44 formed in the rear of the shelf 26. Flanges 28 and 30 are provided on the shelf 26 and fastened to the surfaces 12a and 14a of the posts 12 and 14 by screws. The distance between the posts 12 and 14 is maintained the same throughout their length by the top frame 16 and base 18. The base 18 is formed with holes 20 for affixing the rack 40 to the floor of a building.

Figure 4:
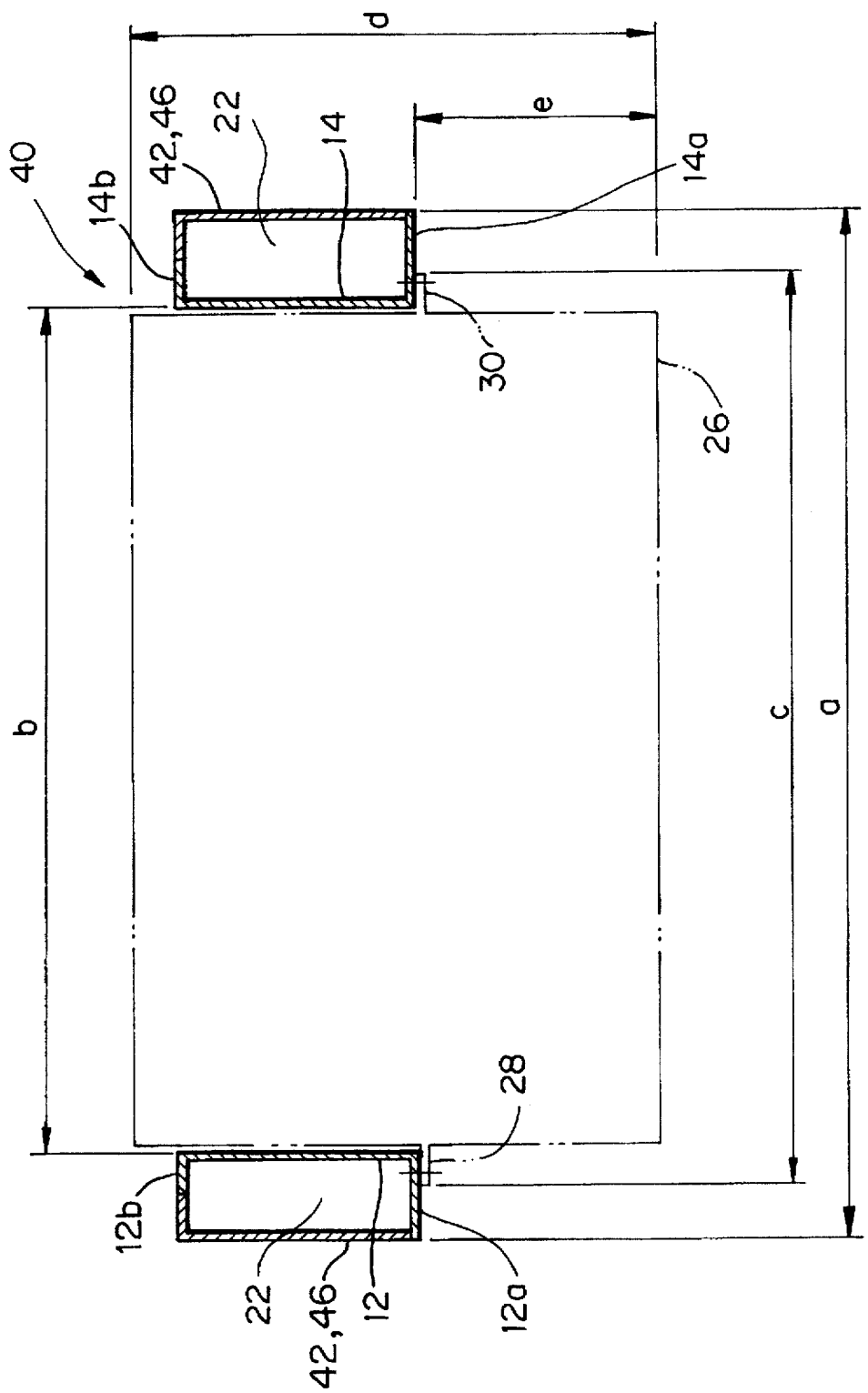
FIG. 4 is a horizontal section of the embodiment.

As shown in FIG. 4, the rack 40 has an outside width a and an inside width b while the shelf 26 has a width c, a total depth d, and a mounting depth e. Even when such five dimensions a–e are standardized and not easy to change, the rack 40 can achieve greater rigidity than the conventional rack 10 without any problem in practical use, while avoiding the contradictory relation between weight (W) and secondary moment of section (I). The words "without any problem in practical use" refer to the fact that the cable ducts 22 are not narrower than in the conventional structure, and that the shelf 26 can be mounted to the rack 40 as easily as with the conventional structure. In the illustrative embodiment, the connection of the posts 12 and 14 to the base 18 is (FIG. 3) reinforced by the reinforcing members 42 having an L-shaped section connected between flanges 12a, 12b and 14a, 14b, respectively. This successfully increases the strength of the lower portions of the posts 12 and 14 on which forces usually concentrate in the event of earthquakes, thereby implementing a higher resonance frequency Fr. In addition, since only part of the posts 12 and 14 is reinforced, the increase in weight W is only negligible and does not lower the resonance frequency Fr.

Figure 5:
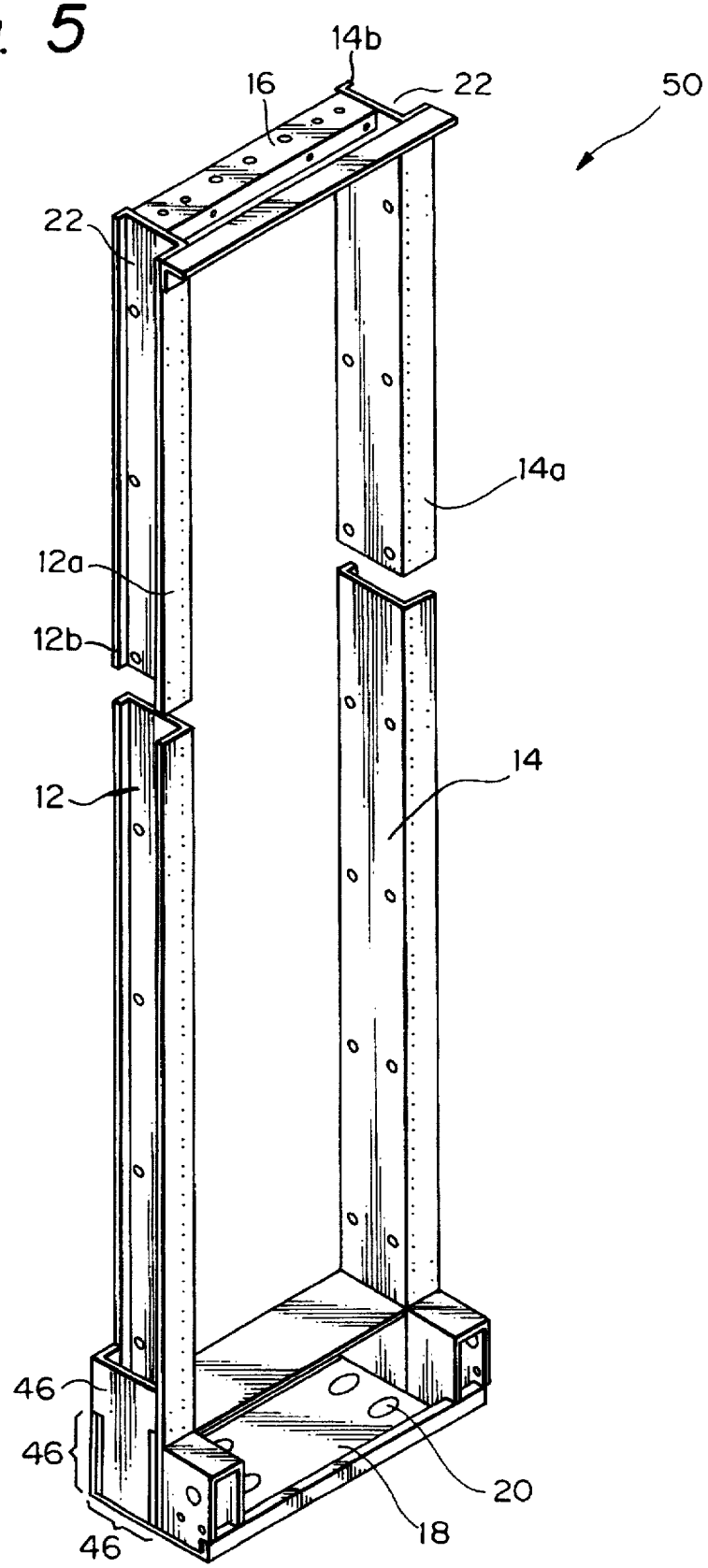
FIG. 5 is a perspective view showing an alternative embodiment of the present invention.

FIG. 5 shows an alternative embodiment of the present invention which is similar to the previous embodiment except for the configuration of the reinforcing members. In FIG. 5, the same or similar constituent parts as the parts shown in FIGS. 3 and 4 are designated by the same reference numerals, and a detailed description thereof will not be made in order to avoid redundancy. As shown, a rack 50 has reinforcing members 46 which are generally T-shaped as seen from the front and provide the posts 12 and 14 with the previously stated hollow rectangular section. Each reinforcing member 46 has the leg of "T" extending parallel to the height of the post 12 or 14 and has opposite arms of "T" affixed at flanges 12a, 12b and 14a, 14b, respectively, to the opposite open ends of "C" representing the post 12 or 14. The leg of "T", representing the reinforcing member 46, is affixed to the base 18 at the bottom thereof. Lower sides 46a are spaced apart from the base 18 at opposite sides thereof. The section of the reinforcing members 46 is selected by analyzing the deformation of a rack to occur in the event of earthquakes. It is to be noted that the lower portion of the leg of "T" is spaced apart from the post 12 or 14 in order to connect only the portions which are necessary for reinforcement.

In summary, it will be seen that the present invention provides a rack which achieves a high resonance frequency and, therefore, great strength against earthquakes within a limited space and without effecting, for example, the accommodation of cables. This advantage is derived from the fact that posts are not entirely increased in rigidity, but they are provided with a hollow rectangular section only in their lower portions. Further, reinforcing members are connected to posts only at particular portions thereof, so that forces are prevented from concentrating on limited part of the reinforcing members. In addition, the reinforcing members, which are generally T-shaped or L-shaped, implement connection and reinforcement matching desired mechanical strength.

Various modifications will become possible for those skilled in the art after receiving the teachings of the present disclosure without departing from the scope thereof.

What is claimed is:

1. An independent rack for mounting electronic apparatuses, comprising:

a pair of cable duct posts with a mirror image symmetry in a right-and-left direction when said rack is seen from the front, and each of said posts having a cross-section substantially in a form of a letter "C" and being arranged such that an open side of said "C" faces outwardly to receive cables;

a top frame tying upper ends of said pair of posts;

a base to which lower ends of said pair of posts are affixed; and means at a lower portion of each of said pair of posts adjoining said base for closing said open side of said "C" in order to form a hollow rectangular section, wherein said means comprises a pair of reinforcing members having a section in a form of a letter "L" and respectively affixed to said lower portions of said pair of posts such that a longer arm of said "L" is parallel to and closes the open side of said "C", for completing the hollow rectangular section of the post, said pair of reinforcing members being not connected to said base.

2. An independent rack for mounting electronic apparatuses, comprising:

a pair of cable duct posts with a mirror image symmetry in a right-and-left direction when said rack is seen from the front, and each of said posts having a cross-section substantially in a form of a letter "C" and being arranged such that an open side of said "C" faces outwardly to receive cables;

a top frame tying upper ends of said pair of posts;

a base to which lower ends of said pair of posts are affixed; and means at a lower portion of each of said pair of posts adjoining said base for closing said open side of said "C" in order to form a hollow rectangular section, wherein said means comprises a pair of reinforcing members having a generally "T"-shape as seen from the front and each being positioned such that a leg of said "T" is parallel to a direction of a height of the post, opposite arms of said "T" being connected to opposite open ends of said "C", representing said post, said leg being affixed to said base at a bottom thereof and spaced apart from said base at lower opposite sides thereof.

* * * * *